United States Patent
Schneider et al.

(10) Patent No.: US 6,800,817 B2
(45) Date of Patent: Oct. 5, 2004

(54) SEMICONDUCTOR COMPONENT FOR CONNECTION TO A TEST SYSTEM

(75) Inventors: Helmut Schneider, München (DE); Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 350 days.

(21) Appl. No.: 10/055,522

(22) Filed: Jan. 23, 2002

(65) Prior Publication Data

US 2002/0097616 A1 Jul. 25, 2002

(30) Foreign Application Priority Data

Jan. 23, 2001 (DE) .......................................... 101 02 871

(51) Int. Cl.[7] .............................. G01R 31/28; H04L 7/00
(52) U.S. Cl. ........................ 174/733; 714/744; 713/400
(58) Field of Search ................................ 714/733, 724, 714/726, 725, 731, 744, 798, 814; 713/400, 500, 503, 600

(56) References Cited

U.S. PATENT DOCUMENTS 5,734,662 A * 3/1998 Sato ........................... 714/744
6,378,093 B1 * 4/2002 Whetsel ....................... 714/726
6,636,680 B2 * 10/2003 Wu et al. ..................... 385/137

FOREIGN PATENT DOCUMENTS

EP          0 604 188 A2    6/1994

OTHER PUBLICATIONS

IEEE: "IEEE Standard Test Access Port and Boundary Scan Architecture—Scan Architecture", IEEE Standard 1149.1–1990, New York, 1990, pp. 3–1–3–7, 4–1–4–3, 7–20–7.23, 8–1–8–2.

* cited by examiner

*Primary Examiner*—Christine T. Tu
(74) *Attorney, Agent, or Firm*—Laurence A. Greenberg; Werner H. Stemer; Gregory L. Mayback

(57) ABSTRACT

The semiconductor component is provided for connection to a test system. An external clock signal with a modulated duty ratio can be input to the semiconductor component at a connection provided for that purpose on the semiconductor component. The latter has a clock recovery circuit, which obtains a periodic clock signal from the modulated clock signal, and a shift register, to which the modulated clock signal can be fed in a manner clocked by the periodic clock signal and which provides a data signal. The present invention makes it possible, in particular in mass memory chips, to feed in clock signals and also program, address or data signals for the realization of BIST via just one connection contact.

9 Claims, 1 Drawing Sheet

SEMICONDUCTOR COMPONENT FOR CONNECTION TO A TEST SYSTEM

BACKGROUND OF THE INVENTION

Field of the Invention

The invention lies in the semiconductor technology field and pertains, more specifically, to a semiconductor component for connection to a test system and to a test system having the semiconductor component.

In order to provide functional tests in semiconductor chips, for example mass memory chips, it is customary to integrate self-test circuits in the chip (BIST, Built In Self Test).

In a test environment, a test device connected to the chip to be tested (DUT, Device Under Test) can be used to transmit, via a plurality of connection pads or connection pins, clock signals, data signals, addresses and commands to the chip to be tested. For this purpose, it has been customary heretofore to transmit data, commands and addresses in parallel into the DUT. However, this is associated with the disadvantage that a large number of pins or connection legs are required on the chip in order to be able to carry out self-tests.

SUMMARY OF THE INVENTION

It is accordingly an object of the invention to provide a semiconductor component for connection to a test system and a test system having the semiconductor component, which overcomes the above-mentioned disadvantages of the heretofore-known devices and methods of this general type and in which the number of connection legs or pins required for carrying out self-tests on the semiconductor component is reduced.

With the foregoing and other objects in view there is provided, in accordance with the invention, a semiconductor component for connection to a test system, comprising:

at least one connection on the semiconductor component for receiving an external clock signal with a modulated duty ratio;

a clock recovery circuit having an input connected to the at least one connection on the semiconductor component, and an output outputting a periodic clock signal having a frequency of the external clock signal with the modulated duty ratio; and a shift register having a serial data input connected to the at least one connection on the semiconductor component, and a clock input connected to the output of the clock recovery circuit.

With the above and other objects in view there is also provided, in accordance with the invention, a test system, comprising at least one semiconductor component according to the above summary, and a test device for testing the at least one semiconductor component, the test device having an output connected to the at least one connection of the at least one semiconductor component and carrying the external clock signal with the modulated duty ratio.

The semiconductor component described has, for carrying out self-tests, just one connection leg or pin or connection pad at which the modulated clock signal can be fed in. With this modulated clock signal, on the one hand it is possible to communicate the reference clock required for the test functions and, on the other hand, it is possible to communicate serially data, addresses and commands for a self-test program in the semiconductor component.

In order that the at least one connection on the semiconductor component can be utilized not only for a test mode but also for a normal mode of the semiconductor component, it is possible to provide a changeover switch or multiplexer for coupling shift register input and clock recovery circuit input to the external connection on the semiconductor component, to which, moreover, it is possible to connect a circuit section for carrying out a normal mode in the semiconductor component.

The clock recovery circuit in the semiconductor component enables the recovery of a periodic clock signal from the modulated clock signal. The shift register is driven by this recovered, periodic clock signal at a clock input, with the result that correctly timed sampling of the modulated clock signal, for example with the falling edge of the recovered clock signal, provides demodulation of a data signal from the modulated clock signal in the shift register.

A clock signal is to be understood as a periodic signal, for example a square-wave signal with a symmetrical duty ratio, that is to say a duty cycle of, for example, 50 percent. This means that 50% of the clock period duration of the clock signal is equal to the duration of a high level in the clock signal. The temporal profile of a clock signal is accordingly determined at any arbitrary instant.

A data signal is understood as a signal with a signal profile that is not known a priori. Consequently, a data signal is not usually a periodic signal.

The frequency identity of periodic clock signal and modulated clock signal is understood as the identity of the period durations of the two signals.

The transmission of data, addresses or commands with the modulated clock signal can be effected in packets. In this case, each packet may contain additional information as to whether the information items transmitted in the packet are data, addresses or commands. In the semiconductor component, a decoder which decodes the correspondingly identified packet information items may be provided in a test circuit. With the present semiconductor component, long data sequences, for example different programs for carrying out a BIST, Built In Self Test, can also be loaded into the semiconductor component. Furthermore, costs are saved with the present semiconductor component since only one pin or connection on the semiconductor component has to be contact-connected in a test environment. Moreover, it is thus possible to increase the number of semiconductor components that can be tested simultaneously by a test device through a higher degree of parallelization and to save time and costs. This is advantageous in particular in mass production processes with large numbers, as are customary in chip fabrication.

In accordance with an added feature of the invention, the semiconductor component is a mass memory chip. A test environment that is simple to realize or a test system is particularly advantageous in mass memory chips, for example for checking the memory cells for defects.

In accordance with an additional feature of the invention, the semiconductor component is a DRAM, Dynamic Random Access Memory, with a memory space of greater than or equal to 64 Megabits. However, the semiconductor component may also have a memory space of less than 64 Mbit.

In accordance with another feature of the invention, the periodic clock signal is a square-wave signal with a symmetrical duty ratio of 50%. Duty ratio is also referred to as duty cycle. A duty ratio of 50% means that, within a clock period, the time duration of a logic high level is equal to the time duration of a logic low level is equal to half the period duration of the clock signal. Although a duty ratio of 50% is particularly advantageous, a semiconductor component for operation with a duty ratio other than 50% also lies within the scope of the invention.

In accordance with a further preferred embodiment of the present invention, the shift register is a 4-bit shift register. In this case, under the control of the regenerated clock signal, the 4 bits of memory space of the shift register are read bit by bit serially into the shift register. In a further preferred embodiment of the present invention, the clock input of the shift register is an input which triggers the data input of the shift register in response to the falling edge. This defines in each case periodically recurring evaluation instants with regard to the modulated clock signal at which in each case the modulated clock signal can be sampled and, by this means, in a simple manner, a data signal with which the clock signal is modulated can be recovered.

Depending on the application, significantly larger shift registers than 4-bit shift registers can also advantageously be used, for example when addresses such as row and/or column addresses are to be stored for a memory chip.

In accordance with again an added feature of the invention, the shift register has a parallel data output for parallel read-out of the shift register. This enables parallel further processing of the recovered data signal, which has, for example, data, addresses or commands.

In accordance with again another feature of the invention, a decoder is connected to the parallel data output of the shift register, having a data output, an address output and a command output. In order to provide BIST functions or programs, the decoder can decode the data signal read in in parallel and separate the information items transmitted with the modulated clock signal into the transmitted data, addresses or commands.

The present invention additionally provides a test system having a test device for testing the semiconductor component, having an output, which is connected to the at least one connection of the semiconductor component and at which can be derived the clock signal with a modulated duty ratio. The test device may provide, for example, data packets with data, addresses or commands at its output. Test devices usually have only a limited number of programmable connections for the connection of semiconductor components. The test system described makes it possible for more semiconductor components than before to be tested simultaneously, since each semiconductor component to be tested has just one connection which is to be contact-connected and via which clock and data signals can be transmitted, as described.

Other features which are considered as characteristic for the invention are set forth in the appended claims.

Although the invention is illustrated and described herein as embodied in a semiconductor component for connection to a test system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
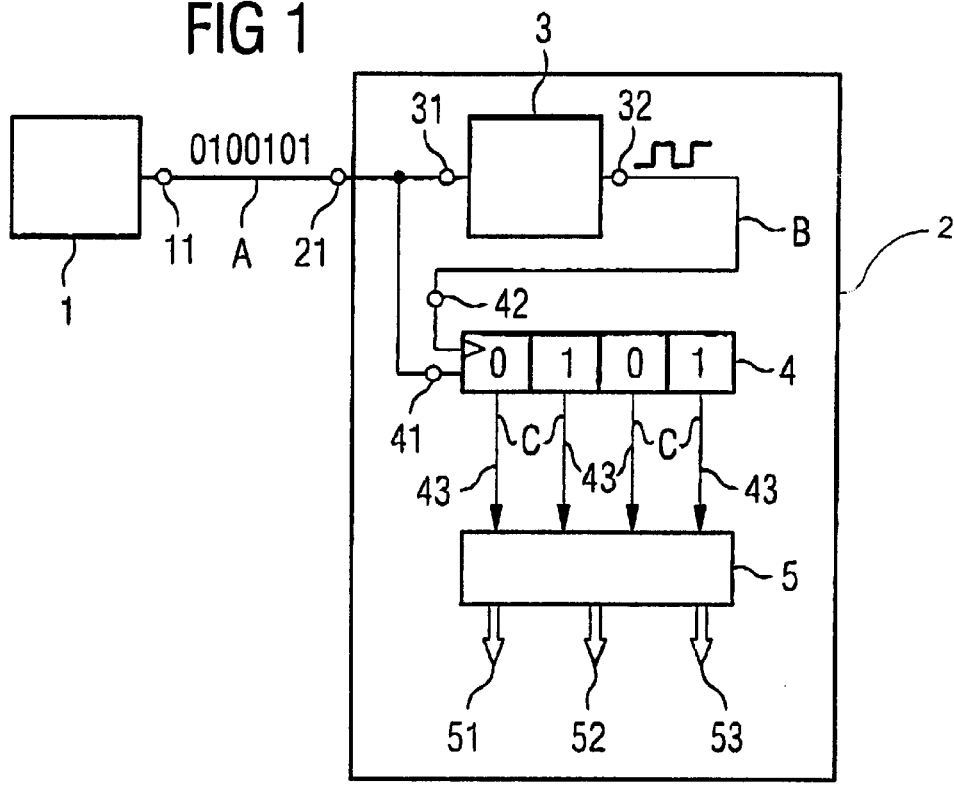
FIG. 1 is a block diagram showing a first exemplary embodiment of the invention.

Referring now to the figures of the drawing in detail and first, particularly, to FIG. 1 thereof, there is seen a test system having a test device 1 and also a semiconductor component 2. The test device has an output 11, which is connected to an input connection 21 of the semiconductor component 2 for feeding in a modulated clock signal. In this case, the modulated clock signal is designated by A and has a duty ratio modulated with a data signal.

The semiconductor component 2 furthermore comprises a clock recovery circuit 3 and also a shift register 4, which are each connected on the input side to the connection 21 for feeding in the modulated clock signal A. For this purpose, the clock recovery circuit 3 has an input 31 and also an output 32, at which can be derived a periodic clock signal B recovered from the modulated clock signal A. The recovered clock signal B, which is periodic and has a symmetrical duty cycle of 50% which is identical in each clock period, in this case has the same frequency as the modulated clock signal A.

The shift register 4 has a data input 41, which, like the input 31 of the clock recovery circuit 3, is connected to the connection 21 of the semiconductor component 2. Moreover, the shift register 4 has a clock input 42, which is connected to the output 32 of the clock recovery circuit for the transmission of the periodic clock signal B. In this case, the clock input 42 is a clock input which triggers in response to the falling edge of the periodic clock signal B. The triggering in response to the falling edge of a periodic clock signal can be realized in circuitry for example by a transmission gate.

Accordingly, bits of the data signal with which the modulated clock signal A is modulated are read into the shift register 4 serially and bit by bit with the pulses of the clock signal.

The shift register 4 has a parallel data output 43, which is coupled to a decoder 5 for the transmission of the data signal. The data signal may have, as information, for example data, commands or addresses for programming a BIST, Built In Self Test, in the semiconductor component 2. The decoder 5 has three outputs 51, 52, 53. The output 51 is a data output, the output 52 is an address output, and the output 53 is a command output.

The test system described can be realized by simple circuitry means and enables the transmission of signals required for realizing BIST in memory chips via just one connection contact. The outlay in respect of time and costs which is required for testing memory chips can thus be significantly reduced.

Figure 2:
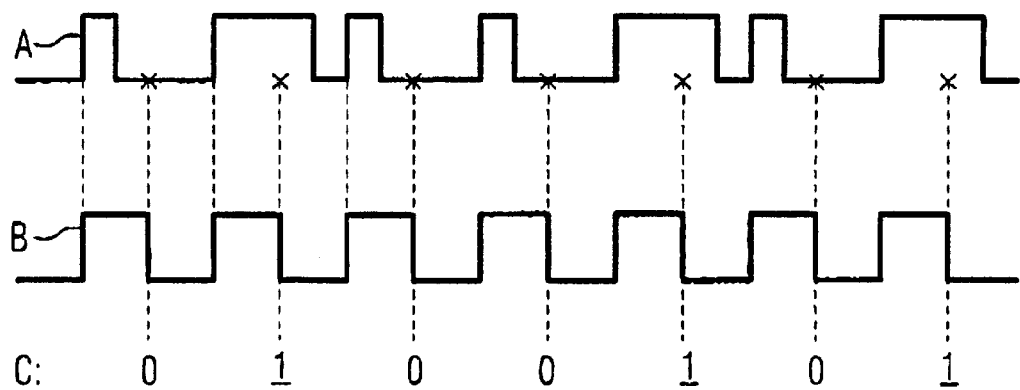
FIG. 2 is a graph showing exemplary signal profiles of selected signals from the block diagram of FIG. 1.

FIG. 2 shows exemplary signal profiles of the modulated clock signal A, of the recovered periodic clock signal B and of the data signal C in accordance with the test system of FIG. 1. It can be seen that although the clock signal A has a periodic frequency, that is to say a constant period duration, the duty ratio, that is to say the duty cycle of the clock signal, is modulated. The intervals between the rising edges of the clock signal A are always identical. The periodic clock signal B likewise has an always identical frequency, that is to say in each case identical period durations. Moreover, clock signal B has a symmetrical duty ratio of 50%, however, so that the duration of a logic high level in the clock signal B is always equal to the subsequent logic zero level of the clock signal B. To put it another way, the clock signal B has a time ratio of logic 1 to total duration of the clock period of 50%. If the modulated clock signal A is now sampled in each case at the time of the falling edge of the periodic clock signal B, then the transmitted data signal C can be recovered in a simple manner. A bit sequence which reads 0100101 is transmitted in the example in accordance with FIG. 2.

The present test system enables, in a simple manner, transmission both of a clock signal and of data, program or address information via only one connection pin of a semiconductor component. This is advantageous particularly in the application of the test system in mass memory chips.

We claim:

1. A semiconductor component for connection to a test system, comprising:

at least one connection on the semiconductor component for receiving an external clock signal with a modulated duty ratio;

a clock recovery circuit having an input connected to said at least one connection on the semiconductor component, and an output outputting a periodic clock signal having a frequency of the external clock signal with the modulated duty ratio; and a shift register having a serial data input connected to said at least one connection on the semiconductor component, and a clock input connected to said output of said clock recovery circuit.

2. The semiconductor component according to claim 1, wherein the semiconductor component is a mass memory chip.

3. The semiconductor component according to claim 2, wherein the semiconductor component is a dynamic random access memory device, with a memory space of greater than or equal to 64 Megabits.

4. The semiconductor component according to claim 1, wherein the periodic clock signal is a square-wave signal with a symmetrical duty ratio of 50%.

5. The semiconductor component according to claim 1, wherein said shift register is a 4-bit shift register.

6. The semiconductor component according to claim 1, wherein said clock input of said shift register is an input triggering a data input of said shift register in response to a falling edge of a clock signal present at said clock input.

7. The semiconductor component according to one of claims 1 to 6, wherein the shift register has a parallel data output for parallel read-out of the shift register.

8. The semiconductor component according to claim 7, which comprises a decoder connected to a parallel data output of said shift register, said decoder having a data output, an address output, and a command output.

9. A test system, comprising at least one semiconductor component according to claim 1, and a test device for testing said at least one semiconductor component, said test device having an output connected to the at least one connection of the at least one semiconductor component and carrying the external clock signal with the modulated duty ratio.

* * * * *